US 7,902,547 B2

(12) United States Patent
Aoki

(10) Patent No.: US 7,902,547 B2
(45) Date of Patent: Mar. 8, 2011

(54) THIN-FILM TRANSISTOR, ELECTRO-OPTICAL DEVICE, AND ELECTRONIC APPARATUS

(75) Inventor: Takashi Aoki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 244 days.

(21) Appl. No.: 12/260,816

(22) Filed: Oct. 29, 2008

(65) Prior Publication Data

US 2009/0146138 A1 Jun. 11, 2009

(30) Foreign Application Priority Data

Dec. 11, 2007 (JP) .................... 2007-320243

(51) Int. Cl.
*H01L 51/30* (2006.01)
(52) U.S. Cl. .................... 257/40; 257/E51.007
(58) Field of Classification Search ............ 257/40, 257/E51.001–E51.052; 438/99
See application file for complete search history.

(56) References Cited

U.S. PATENT DOCUMENTS

| 6,661,024 B1* | 12/2003 | Zhang et al. | 257/40 |
| 2007/0215377 A1* | 9/2007 | Aoki | 174/250 |
| 2007/0221958 A1* | 9/2007 | Aoki | 257/211 |
| 2008/0283833 A1* | 11/2008 | Kim et al. | 257/59 |

FOREIGN PATENT DOCUMENTS

JP 2005-101555 A 4/2005

OTHER PUBLICATIONS

Yasuda, T., et al. "Organic Field-Effect Transistor with Gate Dielectric Films of Poly-p-Xylylene Derivatives Prepared by Chemical Vapor Deposition." Jpn. J. Appl. Phys., vol. 42 (2003): pp. 6614-6618.*

Yasuda, T., et al. "Poly-p-Xylylene Derivatives as Non-Solution Processible Gate Dielectric Materials for Organic Field-Effect Transistor." Proc. of SPIE, vol. 5217 (2003): pp. 202-209.*

* cited by examiner

*Primary Examiner* — Matthew W Such
(74) *Attorney, Agent, or Firm* — AdvantEdge Law Group, LLC

(57) ABSTRACT

A thin-film transistor includes a source electrode, a drain electrode arranged apart from the source electrode, an organic semiconductor layer arranged between the source electrode and the drain electrode so as to establish connection of the source electrode and the drain electrode, a first insulating layer arranged on one surface side of the organic semiconductor layer, a gate electrode arranged on a side of the first insulating layer opposite that on which the organic semiconductor layer lie, and a second insulating layer arranged on a side of the organic semiconductor layer opposite that on which the first insulating layer lie. The organic semiconductor layer contains an organic semiconductor material having p-type semiconducting properties. The second insulating layer contains one or more compounds of the following formula (1), so that electrons are fed from the second insulating layer into the organic semiconductor layer:

$$\left(\!\!-R^1-\!\!\!\begin{array}{c}X^1\quad X^2\\ \phantom{-}\\ X^3\quad X^4\end{array}\!\!\!-R^2-\!\!\right)_n \quad (1)$$

wherein $R^1$ and $R^2$ independently represent a substituted or unsubstituted alkylene group; $X^1$, $X^2$, $X^3$ and $X^4$ each represent a hydrogen atom or an electron-donating group; and n represents 100 to 100,000, wherein at least one of $X^1$, $X^2$, $X^3$ and $X^4$ represents an electron-donating group.

15 Claims, 7 Drawing Sheets

THIN-FILM TRANSISTOR, ELECTRO-OPTICAL DEVICE, AND ELECTRONIC APPARATUS

BACKGROUND

1. Technical Field

The present invention relates to thin-film transistors, electro-optical devices, and electronic apparatuses.

2. Related Art

In recent years, organic thin-film field-effect transistors composed of organic semiconductor materials have been receiving attention as devices that would substitute for thin-film field-effect transistors composed of inorganic materials such as silicon.

The reason for this is as follows: for example, (I) since organic thin-film field-effect transistors can be produced at lower temperatures than those of transistors composed of inorganic semiconductor materials, plastic substrates and films can be used as substrates. This makes it possible to produce flexible, lightweight, and durable thin-film transistors; (II) thin-film transistors can be produced in a short period of time by simple methods, such as application methods and printing, including supplying solutions containing organic materials, thereby achieving significantly low process cost and equipment cost; (III) various organic materials can be used. Thus, material properties and characteristics of thin-film transistors can be easily drastically changed by changing molecular structures; and (IV) combinations of different functions of organic semiconductor materials can achieve functions and characteristics of thin-film transistors, in which the functions and characteristics cannot be achieved by the use of inorganic semiconductor materials.

In the case where organic semiconductor layers are composed of organic semiconductor materials having p-type semiconducting properties, such organic thin-film transistors serve as switching elements in which no current flows between source electrodes and drain electrodes when no voltage is applied to gate electrodes (OFF state) and in which current flows between source electrodes and drain electrodes when a negative voltage is applied to gate electrodes (ON state).

To provide excellent functions as switching elements, it has been required to develop thin-film transistors in which substantially no current flows in an OFF state and a large current flows in an ON state.

Hitherto, achieving substantially no current flow in an OFF state has been relatively easy. However, it has been significantly difficult to produce thin-film transistors that allow a large current to flow in an ON state. In recent years, the problem in the ON state has been overcome as results of research and development of thin-film transistors. JP-A-2005-101555 is an example of related art.

Although thin-film transistors that allow a larger current to flow in an ON state have been able to be produced, a problem of current flow in an OFF state has arisen.

SUMMARY

An advantage of some aspects of the invention is that it provides a thin-film transistor including an organic semiconductor layer composed of an organic semiconductor material having p-type semiconductor properties, the thin-film transistor suppressing an OFF-state current and having excellent transistor characteristics, and a highly reliable electro-optical device and electronic apparatus each including the thin-film transistor.

The advantage is achieved by aspects of the invention.

A thin-film transistor according to a first aspect of the invention includes a source electrode, a drain electrode arranged apart from the source electrode, an organic semiconductor layer arranged between the source electrode and the drain electrode so as to establish connection of the source electrode and the drain electrode, a first insulating layer arranged on one surface side of the organic semiconductor layer, a gate electrode arranged on a side of the first insulating layer opposite that on which the organic semiconductor layer, the source electrode, and the drain electrode lie, and a second insulating layer arranged on a side of the organic semiconductor layer, the source electrode, and the drain electrode opposite the side adjacent to the first insulating layer. The organic semiconductor layer contains an organic semiconductor material having p-type semiconducting properties. The second insulating layer contains one or more compounds of the following formula (1), so that electrons are fed from the second insulating layer into the organic semiconductor layer:

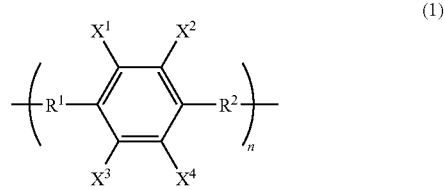

(1)

wherein $R^1$ and $R^2$ independently represent a substituted or unsubstituted alkylene group; $X^1$, $X^2$, $X^3$ and $X^4$ each represent a hydrogen atom or an electron-donating group; and n represents 100 to 100,000, wherein at least one of $X^1$, $X^2$, $X^3$ and $X^4$ represents an electron-donating group.

Thus, the thin-film transistor including the organic semiconductor layer composed of the organic semiconductor material having p-type semiconductor properties can suppress an OFF-state current and have excellent transistor characteristics.

In the thin-film transistor according to the first aspect of the invention, preferably, the alkylene group has 1 to 20 carbon atoms.

Thus, the compound of the formula (1) is easily synthesized, thereby easily producing the thin-film transistor at low cost.

In the thin-film transistor according to the first aspect of the invention, preferably, any two of $X^1$, $X^2$, $X^3$ and $X^4$ represent the electron-donating groups.

Thus, the compound of the formula (1) is easily synthesized, thereby easily producing the thin-film transistor at low cost.

In the thin-film transistor according to the first aspect of the invention, preferably, the second insulating layer contains two or more of the one or more compounds of the formula (1), the compounds having different combinations of $X^1$, $X^2$, $X^3$, and $X^4$.

In this case, i.e., the second insulating layer contains two or more of the one or more compounds of the formula (1); hence, the number of the electron-donating groups in the second insulating layer can be relatively easily adjusted, so that the number of electrons fed from the second insulating layer into the organic semiconductor layer can be relatively easily adjusted.

In the thin-film transistor according to the first aspect of the invention, preferably, the electron-donating group has an amino group.

An amino group exhibits particularly excellent electron-donating properties. Furthermore, the one or more compounds of the formula (1) containing an amino group serving as an electron-donating group is easily synthesized. Therefore, an amino group is suitably selected as an electron-donating group.

In the thin-film transistor according to the first aspect of the invention, preferably, the organic semiconductor material having p-type semiconducting properties is a thiophene-based material.

A problem in which the OFF-state current flows is more noticeable when a thiophene-based material is used as the organic semiconductor material. Thus, the application of an embodiment of the invention to a thin-film transistor containing the thiophene-based material serving as the organic semiconductor material surely eliminates the problem.

In the thin-film transistor according to the first aspect of the invention, preferably, the one or more compounds of the formula (1) each have a weight-average molecular weight of 10,000 to 1,000,000.

The one or more compounds of the formula (1) having a weight-average molecular weight within the range above can be easily synthesized. Furthermore, an increase in the number of electron-donating groups can ensure that electrons are fed from the second insulating layer into the organic semiconductor layer.

In the thin-film transistor according to the first aspect of the invention, preferably, the second insulating layer contains at least one of poly(amino-p-xylylene) of the formula (2) and poly(methylamino-p-xylylene) of the formula (3) as the one or more compounds of the formula (1):

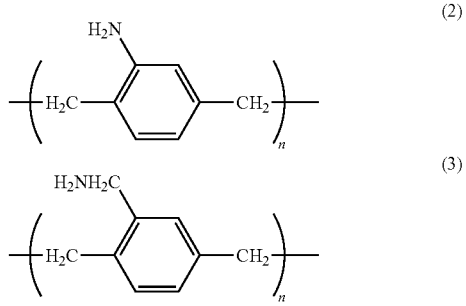

wherein ns each represent 100 to 100,000.

In this case, the thin-film transistor can assuredly suppresses an OFF-state current and have higher performance.

In the thin-film transistor according to the first aspect of the invention, preferably, the second insulating layer, the source electrode, the drain electrode, the organic semiconductor layer, the first insulating layer, and the gate electrode are arranged on a substrate, and the gate electrode is more distant from the substrate than the source electrode and the drain electrode.

In the thin-film transistor according to the first aspect of the invention, preferably, the second insulating layer, the source electrode and the drain electrode, the organic semiconductor layer, the first insulating layer, and the gate electrode are stacked in that order on the substrate.

Thus, the thin-film transistor including the organic semiconductor layer composed of the organic semiconductor material having p-type semiconductor properties can suppress an OFF-state current and have excellent transistor characteristics.

In the thin-film transistor according to the first aspect of the invention, preferably, the second insulating layer, the organic semiconductor layer, the source electrode and the drain electrode, the first insulating layer, and the gate electrode are stacked in that order on the substrate.

Thus, the thin-film transistor including the organic semiconductor layer composed of the organic semiconductor material having p-type semiconductor properties can suppress an OFF-state current and have excellent transistor characteristics.

In the thin-film transistor according to the first aspect of the invention, preferably, the second insulating layer, the source electrode and the drain electrode, the organic semiconductor layer, the first insulating layer, and the gate electrode are arranged on a substrate, and the gate electrode is closer to the substrate than the source electrode and the drain electrode.

In the thin-film transistor according to the first aspect of the invention, preferably, the gate electrode, the first insulating layer, the source electrode and the drain electrode, the organic semiconductor layer, and the second insulating layer are stacked in that order on the substrate.

Thus, the thin-film transistor including the organic semiconductor layer composed of the organic semiconductor material having p-type semiconductor properties can suppress an OFF-state current and have excellent transistor characteristics.

In the thin-film transistor according to the first aspect of the invention, preferably, the gate electrode, the first insulating layer, the organic semiconductor layer, the source electrode and the drain electrode, and the second insulating layer are stacked in that order on the substrate.

Thus, the thin-film transistor including the organic semiconductor layer composed of the organic semiconductor material having p-type semiconductor properties can suppress an OFF-state current and have excellent transistor characteristics.

An electro-optical device according to a second aspect of the invention includes a thin-film transistor according to the first aspect of the invention.

Thus, the electro-optical device has highly reliable.

An electronic apparatus according to a third aspect of the invention includes an electro-optical device according to the second aspect of the invention.

Thus, the electronic apparatus has highly reliable.

BRIEF DESCRIPTION OF THE DRAWINGS

The invention will be described with reference to the accompanying drawings, wherein like numbers reference like elements.

DESCRIPTION OF EXEMPLARY EMBODIMENTS

A thin-film transistor, an electro-optical device, and an electronic apparatus according to embodiments of the invention will be described in detail on the basis of preferred embodiments shown in the attached drawings.

First Embodiment

A first embodiment of the invention will be described below.

(1) Thin-Film Transistor

Figure 1:
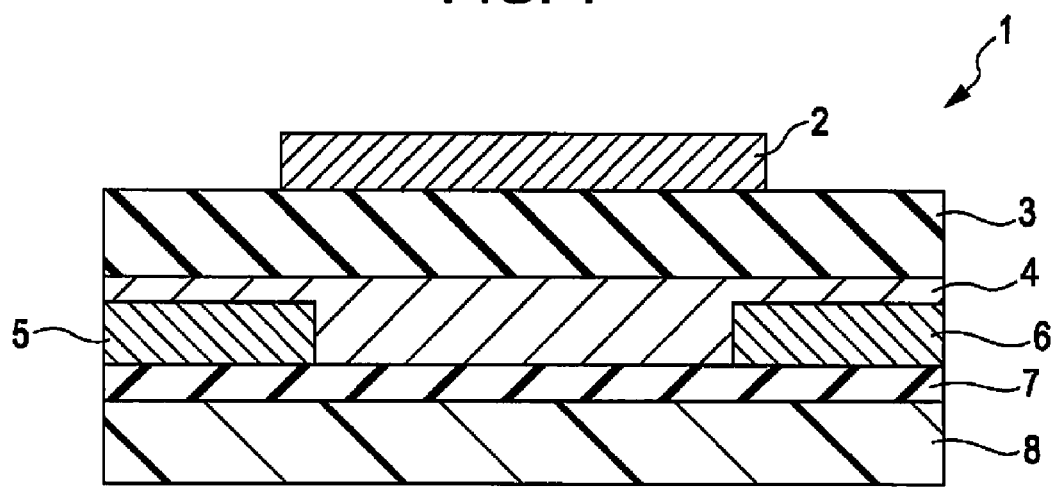
FIG. 1 is a longitudinal sectional view of a thin-film transistor according to a first embodiment of the invention.

FIG. 1 shows a thin-film transistor according to the first embodiment of the invention and is a schematic longitudinal sectional view of a thin-film transistor 1. In the following description, the upper side and the lower side in FIG. 1 is defined as the upper side and the lower side of the thin-film transistor 1.

The thin-film transistor 1 according to this embodiment shown in FIG. 1 includes a gate electrode 2, a first insulating layer 3, an organic semiconductor layer 4, a source electrode 5, a drain electrode 6, and a second insulating layer 7. The second insulating layer 7, the source electrode 5 and the drain electrode 6, the organic semiconductor layer 4, the first insulating layer 3, and the gate electrode 2 are formed in that order on a substrate 8. That is, the thin-film transistor 1 according to this embodiment is a top-gate bottom-contact organic thin-film transistor.

These components will be described below.

The gate electrode 2 is configured to apply an electric field to the organic semiconductor layer 4. As shown in FIG. 1, the gate electrode 2 is arranged on one surface side of the substrate 8 so as to be in contact with the first insulating layer 3 without being in contact with the source electrode 5 or drain electrode 6.

In other words, the gate electrode 2 is arranged on the organic semiconductor layer 4, the source electrode 5, and the drain electrode 6 with the first insulating layer 3 provided between the gate electrode 2 and the organic semiconductor layer 4.

In this embodiment, the gate electrode 2 is located above the source electrode 5 and the drain electrode 6 (remote from the substrate 8) to form the top-gate thin-film transistor 1.

The material constituting the gate electrode 2 is not particularly limited as long as the material has electrical conductivity. Specific examples thereof include metals, such as chromium, aluminum, tantalum, molybdenum, niobium, copper, silver, gold, platinum, palladium, indium, nickel, and neodymium, and alloys thereof; conductive metal oxides, such as zinc oxide, tin oxide, indium oxide, and gallium oxide; conductive metal complex oxides, such as indium tin complex oxide (ITO), indium zinc complex oxide (IZO), aluminum zinc complex oxide (AZO), and gallium zinc complex oxide (GZO); conductive polymers, such as polyaniline, polypyrrole, polythiophene, and polyacetylene, and conductive polymers doped with acids, e.g., hydrochloric acid, sulfuric acid, and sulfonic acid, Lewis acids, e.g., phosphorus pentafluoride, arsenic pentafluoride, and iron chloride, halogen elements, e.g., iodine, and metals, e.g., sodium and potassium; and conductive composite materials containing carbon black and metal particles dispersed. Furthermore, polymer mixtures containing conductive particles, such as fine metal particles and graphite, may be used. These materials may be used alone or in combination. Among these materials, metal alloy are preferred. Chromium-gold alloys are more preferred. In this case, a current flows more easily, affording the thin-film transistor 1 having excellent properties.

The average thickness of the gate electrode 2 is, but not limited to, preferably in the range of about 0.1 to about 2,000 nm and more preferably about 1 to about 1,000 nm.

The first insulating layer 3, serving as a gate insulating film, is configured to insulate the gate electrode 2 from the source electrode 5 and drain electrode 6. The first insulating layer 3 is arranged on one surface side (upper side) of the organic semiconductor layer 4, interposed between the gate electrode 2 and the organic semiconductor layer 4. The first insulating layer 3 is arranged so as to have an upper surface in contact with the gate electrode 2 and a lower surface in contact with the organic semiconductor layer 4.

The material constituting the first insulating layer 3 is not particularly limited as long as the material has insulation properties. Examples of the material that can be used include organic insulating materials, inorganic insulating materials, and mixed materials thereof.

Examples of organic insulating materials include polymers, such as polymethyl methacrylate, polyvinylphenol, polyimide, polystyrene, polyvinyl alcohol, and polyvinyl acetate. These may be used alone or in combination.

Furthermore, compounds represented by the formula (1) described below may be used as the organic insulating materials.

Examples of inorganic insulating materials include metal oxides, such as silicon oxide, aluminum oxide, tantalum oxide, zirconium oxide, cerium oxide, zinc oxide, and cobalt oxide; metal nitrides, such as silicon nitride, aluminum nitride, zirconium nitride, cerium nitride, zinc nitride, cobalt nitride, titanium nitride, and tantalum nitride; and metal complex oxides, such as barium strontium titanate and lead zirconate titanate. These may be used alone or in combination.

The average thickness of the first insulating layer 3 is preferably in the range of, but not limited to, 100 to 10,000 nm and more preferably 500 to 1,500 nm. In this case, the operating voltage of the thin-film transistor 1 can be reduced.

The organic semiconductor layer 4 according to an embodiment of the invention contains an organic semiconductor material having p-type semiconducting properties. The organic semiconductor layer 4 is configured to charge positively and allow positive charges to flow from the source electrode 5 to the drain electrode 6 when subjected to an electric field from the gate electrode 2.

The organic semiconductor layer 4 is arranged between the first insulating layer 3 and the second insulating layer 7 so as to have an upper surface in contact with the first insulating layer 3 and a lower surface in contact with the second insulating layer 7. The organic semiconductor layer 4 is arranged so as to constitute a channel region between the source electrode 5 and the drain electrode 6 arranged apart from each other in plan and so as to establish connection between the source electrode 5 and the drain electrode 6.

The material constituting the organic semiconductor layer 4 is not particularly limited as long as the material has p-type semiconducting properties, i.e., properties in which positive charges flow. Specific examples thereof include thiophene-based materials, such as poly(3-alkylthiophene), poly(3-hexylthiophene) (P3HT), poly(3-octylthiophene), poly(2,5-thienylene vinylene) (PTV), quarterthiophene (4T), sexithiophene (6T), octathiophene, 2,5-bis(5'-biphenyl-2'-thienyl)thiophene (BPT3), 2,5-[2,2'-(5,5'-diphenyl)dithienyl]thiophene, and [5,5'-bis(3-dodecyl-2-thienyl)-2,2'-bithiophene] (PQT-12); phenylene vinylene-based materials such as poly(paraphenylene vinylene) (PPV); fluorene-based materials such as poly(9,9-dioctylfluorene) (PFO); triallylamine-based polymers; acene-based materials, such as anthracene, tetracene, pentacene, and hexacene; benzene-based materials, such as 1,3,5-tris[(3-phenyl-6-trifluoromethyl)quinoxalin-2-yl]benzene (TPQ1) and 1,3,5-tris[{3-(4-tert-butylphenyl)-6-trisfluoromethyl}quinoxalin-2-yl]benzene (TPQ2); phthalocyanine-based materials, such as phthalocyanine, copper phthalocyanine (CuPc), iron phthalocyanine, and perfluorophthalocyanine; organometallic materials, such as tris(8-hydroxyquinoline) aluminum (Alq3) and fac-tris(2-phenylpyridine) iridium (Ir(ppy)3); C60; polymers, such as, oxadiazole-based polymers, triazole-based polymers, carbazole-based polymers, and fluorene-based polymers; poly(9,9-dioctylfluorene-co-bis-N,N'-(4-methoxyphenyl)-bis-N,N'-phenyl-1,4-phenylenediamine) (PFMO); poly(9,9-dioctylfluorene-co-benzothiadiazole) (BT); fluorene-triallylamine copolymers; and copolymers of fluorene and poly(9,9-dioctylfluorene-co-dithiophene) (F8T2). These materials may be alone or in combination.

Among these materials, in the case where a thiophene-based material is used for the organic semiconductor layer 4, an effect induced by the second insulating layer 7 composed of a material described below can be markedly provided. The effect will be described in detail below.

The organic semiconductor layer 4 preferably has an average thickness of 0.5 to 1,000 nm and more preferably 1 to 500 nm. A thickness within the range above permits positive charges to flow assuredly from the source electrode 5 to drain electrode 6, thereby providing effects such as improvement in the mobility of positive charges.

The source electrode 5 and the drain electrode 6 arranged apart from each other are located between the first insulating layer 3 and the second insulating layer 7 and each have a lower surface in contact with the second insulating layer 7. The source electrode 5 faces the drain electrode 6 in plan. The organic semiconductor layer 4 is arranged between the source electrode 5 and the drain electrode 6. In this embodiment, the source electrode 5 and the drain electrode 6 are in contact with lower surfaces of portions of the organic semiconductor layer 4 overlapping the source electrode 5 and the drain electrode 6 in plan, thus constituting the bottom-contact thin-film transistor 1.

In this thin-film transistor 1, a region of the organic semiconductor layer 4 located between the source electrode 5 and the drain electrode 6 serves as a channel region where carriers move. The distance between the source electrode 5 and the drain electrode 6 corresponds to the channel length L. The width of each of the source electrode 5 and the drain electrode 6 in the direction perpendicular to the direction of the channel length L is defined as the channel width W.

The source electrode 5 is composed of a material the same as that constituting the gate electrode 2 described above.

The average thickness of the source electrode 5 is, but not particularly limited to, preferably in the range of 10 to 2,000 nm and more preferably 100 to 1,000 nm. In this case, the mobility of positive charges is increased between the source electrode 5 and the drain electrode 6.

The channel length L is preferably in the range of 1 to 500 μm and more preferably 5 to 20 μm. The channel width W is preferably in the range of 0.05 to 10 mm and more preferably 0.01 to 1 mm. The channel length L and the channel width W within the ranges above results in an appropriate ON-state current and a reduction in parasitic capacitance, thereby affording the thin-film transistor 1 having satisfactory properties.

The second insulating layer 7 (underlying layer) is configured to insulate the substrate 8 from the electrodes 5 and 6 and the organic semiconductor layer 4. The second insulating layer 7 is arranged on a one surface side (upper surface side) of the substrate 8. The organic semiconductor layer 4, the source electrode 5 and the drain electrode 6, the first insulating layer 3, and the gate electrode 2 are formed in that order on the second insulating layer 7. The first insulating layer 3 lies on the upper surface of the organic semiconductor layer 4. The second insulating layer 7 lies on the lower surface of the organic semiconductor layer 4 opposite the upper surface. That is, the second insulating layer 7 is arranged on a side of the organic semiconductor layer 4, the source electrode 5, and the drain electrode 6 opposite the side adjacent to the first insulating layer 3.

The arrangement of the second insulating layer 7 ensures the insulation of the substrate 8 from the electrodes 5 and 6 and the organic semiconductor layer 4, thus expanding the scope of selection of a substrate used for the substrate 8.

The second insulating layer 7 according to an embodiment of the invention contains a compound of the formula (1), so that electrons are fed from the second insulating layer 7 into the organic semiconductor layer 4. The resulting effects will be described in detail below.

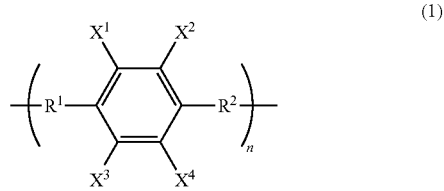

(1)

wherein $R^1$ and $R^2$ independently represent a substituted or unsubstituted alkylene group; $X^1$, $X^2$, $X^3$ and $X^4$ each represent a hydrogen atom or an electron-donating group; and n represents 100 to 100,000, wherein at least one of $X^1$, $X^2$, $X^3$ and $X^4$ represents an electron-donating group.

The substrate 8 is configured to support the layers (elements) arranged on the substrate 8.

Non-limiting examples of the substrate 8 include glass substrates; quartz substrates; silicon substrates; metal substrates composed of, for example, molybdenum sulfide, copper, zinc, aluminum, stainless steel, magnesium, iron, nickel, gold, and silver; semiconductor substrates composed of, for example, gallium arsenide; and plastic substrates.

Among these, the substrate 8 is preferably a plastic substrate. In this case, it is possible to provide the thin-film transistor 1 formed on the lightweight, flexible, and inexpensive substrate 8.

In the case where the compound of the formula (1) is deposited not only on the surface of the substrate 8 on which the transistor is arranged but also on the lower surface of the substrate 8, i.e., the second insulating layer 7 is formed on each of the upper surface and the lower surface of the substrate 8, the substrate 8 has improved process resistance and chemical resistance because of the second insulating layer 7 with satisfactory process resistance and excellent chemical resistance.

Examples of a material constituting the plastic substrate include thermoplastic resins and thermosetting resins. Examples thereof include polyolefins, such as polyethylene, polypropylene, ethylene-propylene copolymers, and ethylene-vinyl acetate copolymers (EVA), cyclic polyolefin, modified polyolefins, polyvinyl chloride, polyvinylidene chloride: polystyrene, polyamide, polyimide (PI), polyamide-imide, polyesters, such as polycarbonate, poly(4-methylpentene-1), ionomers, acrylic-based resins, polymethyl methacrylate, acrylic-styrene copolymers (AS resins), butadiene-styrene copolymers, ethylene vinyl alcohol copolymers (EVOH), polyethylene terephthalate (PET), polybutylene terephthalate, polyethylene naphthalate (PEN), and polycyclohexane terephthalate (PCT), polyether, polyether ketone, polyethersulfone (PES), polyether imide, polyacetal, polyphenylene oxide, modified polyphenylene oxide, polyarylate, aromatic polyesters (liquid crystal polymer), polytetrafluoroethylene, polyvinylidene fluoride, other fluorocarbon resins, thermoplastic elastomers, such as styrene-based elastomers, polyolefin-based elastomers, polyvinyl chloride-based elastomers, polyurethane-based elastomers, fluorocarbon rubbers, and chlorinated polyethylene-based elastomers, epoxy resins, phenolic resins, urea resins, melamine resins, unsaturated polyesters, silicone resins, and polyurethane, and copolymers, blends, and polymer alloys thereof. The plastic substrate may be a single layer substrate composed of one of the materials described above or a multilayer substrate having layers composed of two or more materials.

In the thin-film transistor 1 formed on the substrate 8, a current passing through the organic semiconductor layer 4 located between the source electrode 5 and the drain electrode 6 is controlled by changing a voltage applied to the gate electrode 2.

That is, in an OFF state in which no voltage is applied to the gate electrode 2, a threshold voltage (Vth) is close to zero, substantially no current flows even when a voltage is applied between the source electrode 5 and the drain electrode 6 because carriers are not substantially present in the organic semiconductor layer 4. In an ON state in which a negative voltage is applied to the gate electrode 2, mobile positive charges (carriers) are induced in a portion of the organic semiconductor layer 4 in contact with the first insulating layer 3 to form the path of positive charges in the channel region. The application of a voltage between the source electrode 5 and the drain electrode 6 in this situation allows a current to flow through the channel region (organic semiconductor layer 4).

In such thin-film transistors (switching elements), as described above, thin-film transistors that allow larger currents to flow in ON states have been able to be produced. However, there have been problems in that currents flow in OFF states.

The inventors have conducted intensive studies and have found that a current flow in an OFF state is attributed to the fact that the organic semiconductor layer composed of an organic semiconductor material having p-type semiconducting properties is positively charged even in an OFF state, i.e., even when a negative voltage is not applied to the gate electrode.

The inventors have conducted further studies and have found that in the case where a thin-film transistor include the second insulating layer 7, serving as an insulating layer configured to insulate the organic semiconductor layer 4, lying on a surface of the organic semiconductor layer 4 opposite the side adjacent to the gate electrode 2 in addition to the first insulating layer 3 lying on a side of the organic semiconductor layer 4 adjacent to the gate electrode 2 and where the second insulating layer 7 contains the compound of the formula (1) described above, the foregoing problems can be overcome. These findings have led to the completion of the invention.

The second insulating layer 7 contains the compound of the formula (1), i.e., the second insulating layer 7 contains the compound having a poly-p-xylylene skeleton provided with electron-donating group, thereby feeding electrons from the second insulating layer 7 into the organic semiconductor layer 4. As a result, the number of positive charges in the organic semiconductor layer 4 decreases to nearly zero. Thus, substantially no current flows in an OFF state, thereby improving properties of the thin-film transistor 1.

In the thin-film transistor 1 includes the second insulating layer 7, although an OFF-state current is close to zero, an ON-state current is slightly reduced. This does not adversely affect the properties of the thin-film transistor because recent thin-film transistors have allowed large ON-state currents to flow.

The problem in which the OFF-state current increases with increasing ON-state current is more noticeable when a thiophene-based material is used as the organic semiconductor material having p-type semiconducting properties. Thus, the application of an embodiment of the invention to a thin-film transistor containing the thiophene-based material serving as the organic semiconductor material assuredly provides the foregoing effects.

In the formula (1), $R^1$ and $R^2$ are independently represent a substituted or unsubstituted alkylene group.

The alkylene group preferably has 1 to 20 carbon atoms, more preferably 1 to 10 carbon atoms, and still more preferably 1 to 4 carbon atoms. Specific examples thereof include methylene, ethylene, propylene, pentylene, heptane, and nonylene. Among these, a methylene group is particularly preferred. In this case, the compound of the formula (1) can be produced by a simple method.

Non-limiting examples of a substituent with which a hydrogen atom of the alkylene group can be replaced include alkyl groups and alkoxy groups having 1 to 10 carbon atoms.

$X^1$, $X^2$, $X^3$ and $X^4$ each represent a hydrogen atom or an electron-donating group. At least one of them represents an electron-donating group. The electron-donating group is not particularly limited as long as electrons can be fed from the second insulating layer 7 into the organic semiconductor layer 4. Examples thereof include substituents, such as linear alkyl groups, e.g., methyl and ethyl, branched alkyl groups, e.g., tert-butyl, alkoxy groups, e.g., methoxy and ethoxy, alkyleneamino, e.g., amino and —$CH_2$—$NH_2$, hydroxy, aromatic ring, and aromatic heterocyclic; and aromatic ring and aromatic heterocyclic groups having the substituents. Among these, amino-containing groups, e.g., amino and alkyleneamino groups, are particularly preferred. These substituents exhibit particularly excellent electron-donating properties and thus are suitably selected as the electron-donating groups. From the viewpoint of ease of synthesis, an amino group is selected as the substituent.

Any of $X^1$, $X^2$, $X^3$, and $X^4$ may be replaced with a hydrogen atom or the electron-donating group.

For example, in view of the configuration, in the case where $R^1$ and $R^2$ are the same group, when one or three of $X^1$ to $X^4$ represent the electron-donating groups, any one or three of $X^1$ to $X^4$ represent the electron-donating groups. When two of $X^1$ to $X^4$ represent the electron-donating groups, the substituents in any combination of $X^1$ and $X^2$, $X^1$ and $X^3$, or $X^1$ and $X^4$ represent the electron-donating groups.

In the case where $R^1$ and $R^2$ represent different groups, when one of $X^1$ to $X^4$ represent the electron-donating groups, any one of $X^1$ to $X^4$ represent the electron-donating groups. When two of $X^1$ to $X^4$ represent the electron-donating groups, the substituents in any of a combination of $X^2$ and $X^4$ and the combinations of the substituents in the case of disubstitution described above represent the electron-donating groups. When three of $X^1$ to $X^4$ represent the electron-donating groups, the substituents in a combination of $X^1$, $X^2$, and $X^3$ or a combination of $X^1$, $X^2$, and $X^4$ represent the electron-donating groups.

Among these, from the viewpoint of surely feeding the organic semiconductor layer 4 with electrons, at least two of $X^1$ to $X^4$ preferably represent the electron-donating groups. More preferably, all of $X^1$ to $X^4$ represent the electron-donating groups. In this case, electrons can be surely fed from the second insulating layer 7 into the organic semiconductor layer 4, so that the number of positive charges is surely close to zero. From the viewpoint of achieving the relatively easy synthesis of the compound of the formula (1), the compound in which two of $X^1$ to $X^4$ represent the electron-donating groups is selected.

The compound of the formula (1) preferably has a weight-average molecular weight of about 10,000 to about 1,000,000. In other words, n preferably represents 100 to 10,000. The compound of the formula (1) having a weight-average molecular weight within the range above can be easily synthesized. Furthermore, an increase in the number of electron-donating groups ensures that electrons are fed from the second insulating layer 7 into the organic semiconductor layer 4.

In consideration of the contents of the foregoing descriptions, examples of the compound of the formula (1) in which specific $R^1$, $R^2$, and $X^1$ to $X^4$ are combined will be shown below.

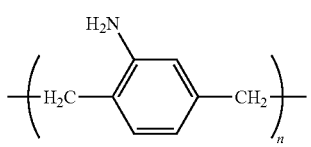

1

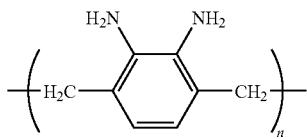

2

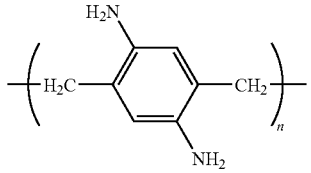

3

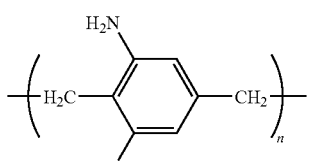

4

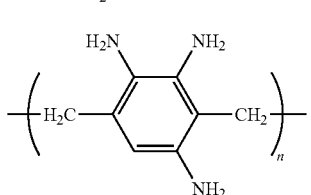

5

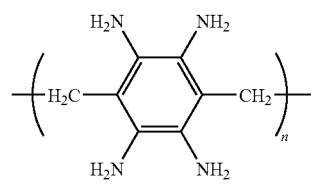

6

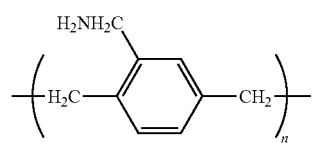

7

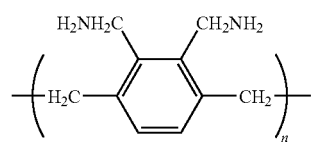

8

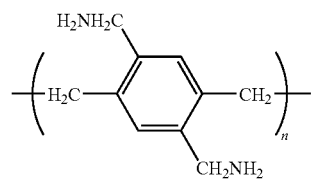

9

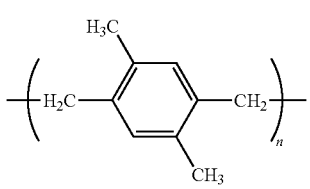

10

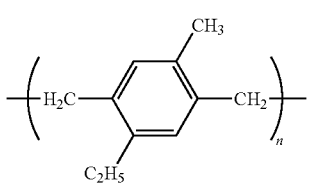

11

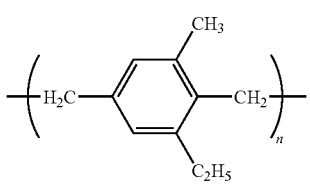

12

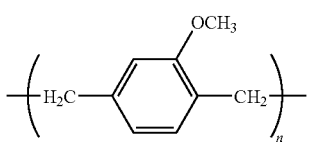

13

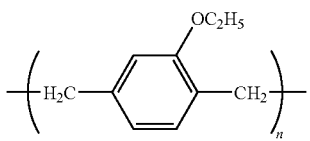

14

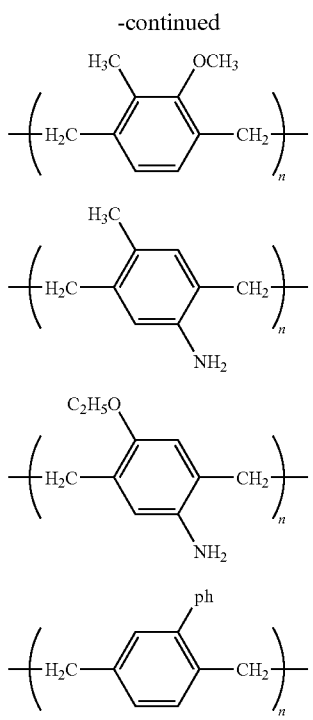

Among these compounds, from the viewpoint of providing an adequate supply of electrons to the organic semiconductor layer 4, the compounds of the chemical formulae 1 and 7, i.e., poly(amino-p-xylylene) and poly(methylamino-p-xylylene) are particularly preferred. Use of the compounds enhances the effects described above.

The second insulating layer 7 preferably has an average thickness of 10 to 10,000 nm and more preferably 200 to 1,000 nm. In this case, it is possible to form the low-cost, high-performance thin-film transistor 1.

The second insulating layer 7 is mainly composed of the compound of the formula (1). The content of the compound of the formula (1) is preferably in the range of 50% to 100% by weight and more preferably in the range of 70% to 100% by weight. In this case, it is surely possible to bring the OFF-state current to substantially zero.

The second insulating layer 7 may contain any other compound or two or more of the compounds of the formula (1) to the extent that the transistor characteristics of the thin-film transistor 1 are not affected, as long as the second insulating layer 7 is mainly composed of the compound of the formula (1). In the case of the second insulating layer 7 containing two or more of the different compounds of the formula (1), i.e., in the case of the second insulating layer 7 containing two or more of the different compounds of the formula (1), the different compounds having different combinations of $X^1$, $X^2$, $X^3$, and $X^4$, advantageously, the number of the electron-donating groups in the second insulating layer 7 can be relatively easily adjusted, so that the number of electrons fed from the second insulating layer 7 into the organic semiconductor layer 4 can be relatively easily adjusted.

Further examples of the compound of the formula (1) include compounds in which all of $X^1$, $X^2$, $X^3$, and $X^4$ represent hydrogen atoms.

The thin-film transistor 1 is preferably used in active matrix units. While active matrix units will be described in detail below, active matrix units are configured to control electro-optical elements, such as liquid crystal elements, polymer-dispersed liquid crystal elements, electrophoretic display elements, electroluminescent elements, and electrochromic elements, formed thereon.

In this case, the thin-film transistor 1 functions as a switching element included in active matrix units. Furthermore, the thin-film transistors 1 may be integrated to serve as logic circuits, such as AND, OR, NAND, and NOT circuits, and digital and analog elements, such as memory elements, oscillation elements, and amplifying elements. Moreover, combinations of these may form IC cards and IC tags.

(2) Method for Producing Thin-Film Transistor

A method for producing the thin-film transistor 1 according to an embodiment of the invention will be described below. The thin-film transistor 1 described above can be produced by, for example, the following method.

The method for producing the thin-film transistor 1 shown in FIG. 1 includes [A1] a step of forming the second insulating layer 7 on the substrate 8, [A2] a step of forming the source electrode 5 and the drain electrode 6 on the second insulating layer 7, [A3] a step of forming the organic semiconductor layer 4 on the source electrode 5, the drain electrode 6, and the second insulating layer 7, [A4] a step of forming the first insulating layer 3 on the organic semiconductor layer 4, and [A5] a step of forming the gate electrode 2 on the first insulating layer 3. Each of the steps will be described below.

[A1] Step of Forming Second Insulating Layer

The second insulating layer 7 is formed on the substrate 8.

The second insulating layer 7 is formed with a chemical vapor deposition apparatus including an evaporation furnace, a decomposition furnace, and a deposition chamber.

First, the substrate 8 is placed in the deposition chamber of the chemical vapor deposition apparatus. A compound, for example, a substituted xylene dimer, serving as a raw material used for the formation of a compound of the formula (1) is evaporated by heat in the evaporation furnace under reduced pressure. The evaporated compound is introduced into the decomposition furnace and pyrolyzed to form a diradical monomer. The resulting diradical monomer is introduced into the deposition chamber. The diradical monomer is attached on the substrate 8 placed in the deposition chamber and radically polymerized, thereby forming the second insulating layer 7 composed of the compound of the formula (1).

In the evaporation furnace, the pressure is preferably in the range of about 0.1 to about 1 Torr, and the temperature is preferably in the range of about 50° C. to about 200° C.

In the decomposition furnace, the pressure is preferably in the range of about 0.1 to about 1 Torr, and the temperature is preferably in the range of about 500° C. to about 1,000° C.

In the deposition chamber, the pressure is preferably in the range of about 0.01 to about 0.5 Pa and more preferably about 0.05 to about 0.2 Pa, and the temperature is preferably in the range of about −50° C. to about 50° C. and more preferably about 10° C. to about 30° C. The deposition rate is preferably in the range of about 0.01 to about 1 μm/min and more preferably about 0.1 to about 0.5 μm/min.

The second insulating layer 7 is appropriately formed under the conditions above.

The second insulating layer 7 composed of the compound of the formula (1), the compound having a weight-average molecular weight (or number-average molecular weight) described above, is surely formed on the substrate 8 through the foregoing step.

In addition to this method, the compound of the formula (1) may be prepared in advance, and then the second insulating layer 7 may be formed by thermal oxidation, CVD, an application method, such as SOG, spin coating, or dipping, or printing such as an ink jet method or screen printing.

The substrate 8 is preferably subjected to pretreatment before the formation of the second insulating layer 7 on the substrate 8, thereby improving adhesion of the second insulating layer 7 composed of the compound of the formula (1) to the substrate 8.

Examples of the pretreatment include surface treatments using surface modifiers, such as hexamethyldisilazane, cyclohexane, and octadecyltrichlorosilane; organic solvent rinsing treatment using acetone and isopropyl alcohol; acid treatments using hydrochloric acid, sulfuric acid, and acetic acid; alkaline treatment using sodium hydroxide, potassium hydroxide, calcium hydroxide, and ammonia; UV-ozone treatment; fluorination treatment; plasma treatments using oxygen and argon; and the treatment of a Langmuir-Blodgett film. These treatments may be employed in combination. Among these, the organic solvent rinsing treatment is particularly preferably employed. In this case, the surfaces of the substrate 8 is surely degreased, so that the second insulating layer 7 is formed with good adhesion to the substrate 8.

[A2] Step of Forming Source Electrode and Drain Electrode

The source electrode 5 and the drain electrode 6 are formed on the second insulating layer 7.

A conductive film is formed on the entire surface of the second insulating layer 7 by, for example, physical vapor deposition, such as vacuum evaporation, ion plating, or sputtering, chemical vapor deposition (CVD), such as plasma-enhanced CVD, thermal CVD, or laser-induced CVD, wet plating, such as electroplating, immersion plating, or electroless plating, an ink jet method, thermal spraying, a sol-gel method, or MOD. The resulting conductive film is patterned by any of various etching methods to form the source electrode 5 and the drain electrode 6.

Alternatively, patterns of the source electrode 5 and the drain electrode 6 can be directly formed on the second insulating layer 7 by the foregoing method with a mask having openings corresponding to the shapes of the source electrode 5 and the drain electrode 6 without etching.

Furthermore, in the case where a polymer mixture containing conductive particles, such as metal microparticles or graphite particles, is used as a electrode-forming material, the patterns of the source electrode 5 and the drain electrode 6 can be simply formed by, for example, an ink jet method with a solution at low cost.

[A3] Step of Forming Organic Semiconductor Layer

The organic semiconductor layer 4 is formed on the second insulating layer 7, the source electrode 5, and the drain electrode 6.

An organic semiconductor material is supplied onto the second insulating layer 7, the source electrode 5, and the drain electrode 6 by, for example, vacuum evaporation, spin coating, casting, dipping, a Langmuir-Blodgett method, spraying, an ink jet method, or silk-screen printing and then, if needed, performing predetermined treatment, thereby forming the organic semiconductor layer 4.

The pretreatment described in the step [A1] is preferably performed before the formation of the organic semiconductor layer 4, thereby improving the adhesion of the second insulating layer 7, the source electrode 5, and the drain electrode 6 to the organic semiconductor layer 4.

[A4] Step of Forming First Insulating Layer

The first insulating layer 3 is formed on the organic semiconductor layer 4.

In the case where the first insulating layer 3 is composed of an inorganic insulating material, the first insulating layer 3 can be formed by, for example, thermal oxidation, CVD, or a spin-on glass method (SOG method).

In the case where the first insulating layer 3 is formed of a silica film or a silicon nitride film, when polysilazane is used as a raw material, the first insulating layer 3 can be formed by a wet process.

In the case where the first insulating layer 3 is composed of an organic insulating material, the first insulating layer 3 can be formed by, for example, applying a solution containing the organic insulating material or a precursor of the organic insulating material to the entire surface of the organic semiconductor layer 4 to form a coating film and then, as needed, subjecting the coating film to post-treatment, e.g., heating, irradiation with infrared rays, or application of ultrasound.

Examples of a method for applying the solution containing the organic material or the precursor thereof to the first insulating layer 3 include application methods, such as spin coating and dip coating, and printing, such as an ink jet method and screen printing.

[A5] Step of Forming Gate Electrode

Finally, the gate electrode 2 is formed on the first insulating layer 3.

The gate electrode 2 is formed on the first insulating layer 3 by the same method as described in the step [A2].

The thin-film transistor 1 according to this embodiment is formed through the steps described above.

Second Embodiment

While a thin-film transistor 1 and a method for producing the same according to a second embodiment will be described below, differences between the first embodiment and the second embodiment will be mainly described. Descriptions of equivalent items are not redundantly repeated.

(1) Thin-Film Transistor

Figure 2:
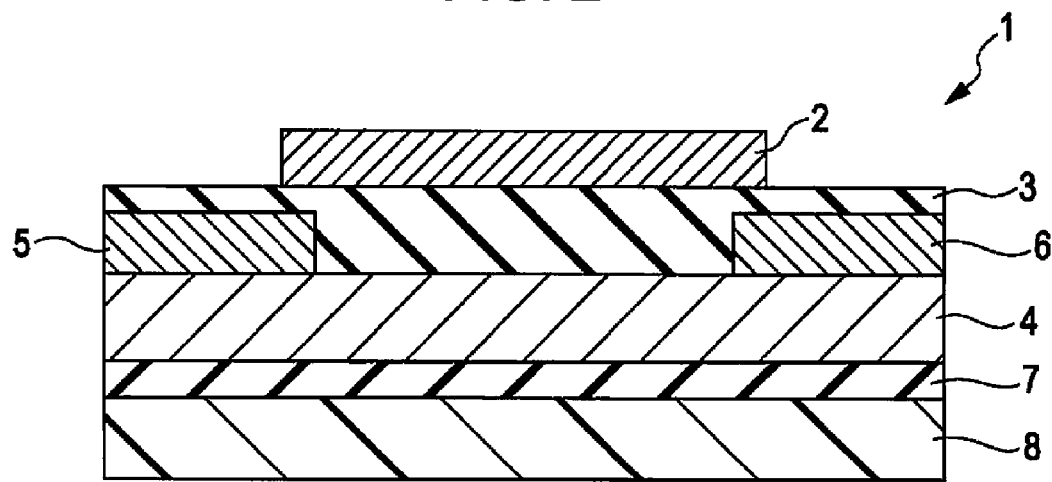
FIG. 2 is a longitudinal sectional view of a thin-film transistor according to a second embodiment of the invention.

FIG. 2 shows a thin-film transistor according to the second embodiment of the invention and is a schematic longitudinal sectional view of a thin-film transistor 1. In the following description, the upper side and the lower side in FIG. 2 is defined as the upper side and the lower side of the thin-film transistor 1.

The thin-film transistor 1 according to this embodiment is the same as in the first embodiment, except that the source electrode 5 and the drain electrode 6 are in contact with upper surfaces of portions of the organic semiconductor layer 4 overlapping the source electrode 5 and the drain electrode 6 in plan.

In other words, the thin-film transistor 1 shown in FIG. 2 includes the second insulating layer 7, the organic semiconductor layer 4, the source electrode 5 and the drain electrode 6, the first insulating layer 3, and the gate electrode 2 stacked, in that order, on the substrate 8, which is a top-gate top-contact thin-film transistor.

The thin-film transistor 1 having the structure also provides the same effects as described in the first embodiment.

(2) Method for Producing Thin-Film Transistor

The thin-film transistor 1 can be produced by, for example, a method described below.

The method for producing the thin-film transistor 1 shown in FIG. 2 includes [B1] a step of forming the second insulating layer 7 on the substrate 8, [B2] a step of forming organic semiconductor layer 4 on the second insulating layer 7, [B3] a step of forming the source electrode 5 and the drain electrode 6 on the organic semiconductor layer 4, [B4] a step of forming the first insulating layer 3 on the source electrode 5, the drain electrode 6, and the organic semiconductor layer 4, and [B5] a step of forming the gate electrode 2 on the first insulating layer 3. Each of the steps will be described below.

[B1] Step of Forming Second Insulating Layer

This step is performed in the same way as in the step [A1] according to the first embodiment.

[B2] Step of Forming Organic Semiconductor Layer

This step is performed in the same way as in the step [A3] according to the first embodiment, except that the organic semiconductor layer 4 is formed on the second insulating layer 7.

[B3] Step of Forming Source Electrode and Drain Electrode

This step is performed in the same way as in the step [A2] according to the first embodiment, except that the source electrode 5 and the drain electrode 6 are formed on the organic semiconductor layer 4.

[B4] Step of Forming First Insulating Layer

This step is performed in the same way as in the step [A4] according to the first embodiment, except that the first insulating layer 3 is formed on the organic semiconductor layer 4, the source electrode 5, and the drain electrode 6.

[B5] Step of Forming Gate Electrode

This step is performed in the same way as in the step [A5] according to the first embodiment.

The thin-film transistor 1 according to this embodiment is formed by the production method including the steps described above.

Third Embodiment

While a thin-film transistor 1 and a method for producing the same according to a third embodiment will be described below, differences between the first embodiment and the third embodiment will be mainly described. Descriptions of equivalent items are not redundantly repeated.

(1) Thin-Film Transistor

Figure 3:
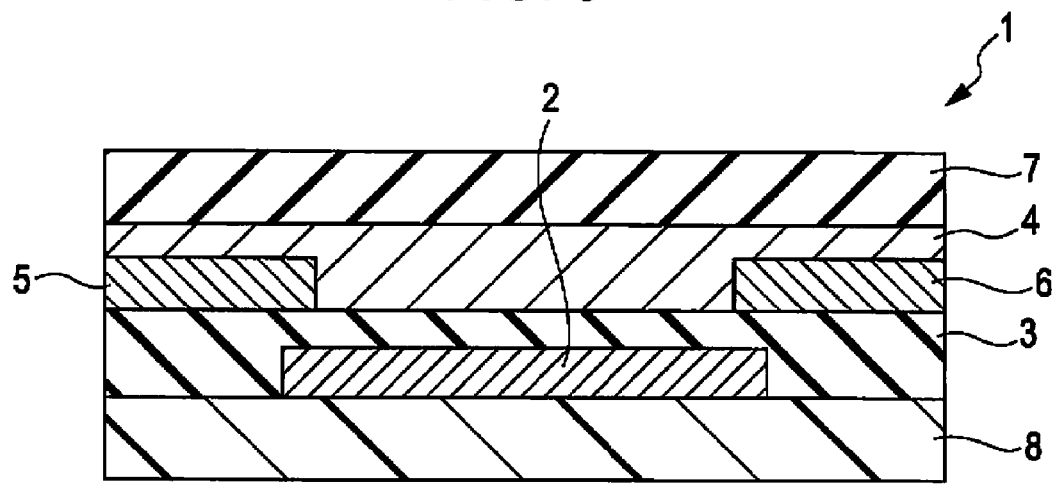
FIG. 3 is a longitudinal sectional view of a thin-film transistor according to a third embodiment of the invention.

FIG. 3 shows a thin-film transistor according to the third embodiment of the invention and is a schematic longitudinal sectional view of a thin-film transistor 1. In the following description, the upper side and the lower side in FIG. 3 is defined as the upper side and the lower side of the thin-film transistor 1.

The thin-film transistor 1 according to this embodiment is the same as in the first embodiment, except that the gate electrode 2 is located closer to the substrate 8 than the source electrode 5 and the drain electrode 6 and that the source electrode 5 and the drain electrode 6 are in contact with lower surfaces of portions of the organic semiconductor layer 4 overlapping the source electrode 5 and the drain electrode 6 in plan.

In other words, the thin-film transistor 1 shown in FIG. 3 includes the gate electrode 2 located closer to the substrate 8 than the source electrode 5 and the drain electrode 6. Furthermore, the thin-film transistor 1 includes the gate electrode 2, the first insulating layer 3, the source electrode 5 and the drain electrode 6, the organic semiconductor layer 4, and the second insulating layer 7 stacked, in that order, on the substrate 8, which is a bottom-gate bottom-contact thin-film transistor.

The thin-film transistor 1 having the structure also provides the same effects as described in the first embodiment.

(2) Method for Producing Thin-Film Transistor

The thin-film transistor 1 can be produced by, for example, a method described below.

The method for producing the thin-film transistor 1 shown in FIG. 3 includes [C1] a step of forming the gate electrode 2 on the substrate 8, [C2] a step of forming the first insulating layer 3 on the substrate 8 and the gate electrode 2, [C3] a step of forming the source electrode 5 and the drain electrode 6 on the first insulating layer 3, [C4] a step of forming the organic semiconductor layer 4 on the source electrode 5, drain electrode 6, and the first insulating layer 3, and [C5] a step of forming the second insulating layer 7 on the organic semiconductor layer 4. Each of the steps will be described below.

[C1] Step of Forming Gate Electrode

This step is performed in the same way as in the step [A5] according to the first embodiment, except that the gate electrode 2 is formed on the substrate 8.

[C2] Step of Forming First Insulating Layer

This step is performed in the same way as in the step [A4] according to the first embodiment, except that the first insulating layer 3 is formed on the substrate 8 and the gate electrode 2.

[C3] Step of Forming Source Electrode and Drain Electrode

This step is performed in the same way as in the step [A2] according to the first embodiment, except that the source electrode 5 and the drain electrode 6 are formed on the first insulating layer 3.

[C4] Step of Forming Organic Semiconductor Layer

This step is performed in the same way as in the step [A3] according to the first embodiment, except that the organic semiconductor layer 4 is formed on the source electrode 5, the drain electrode 6, and the first insulating layer 3.

[C5] Step of Forming Second Insulating Layer

This step is performed in the same way as in the step [A1] according to the first embodiment, except that the second insulating layer 7 is formed on the organic semiconductor layer 4.

The thin-film transistor 1 according to this embodiment is formed by the production method including the steps described above.

Fourth Embodiment

While a thin-film transistor 1 and a method for producing the same according to a fourth embodiment will be described below, differences between the first embodiment and the fourth embodiment will be mainly described. Descriptions of equivalent items are not redundantly repeated.

(1) Thin-Film Transistor

Figure 4:
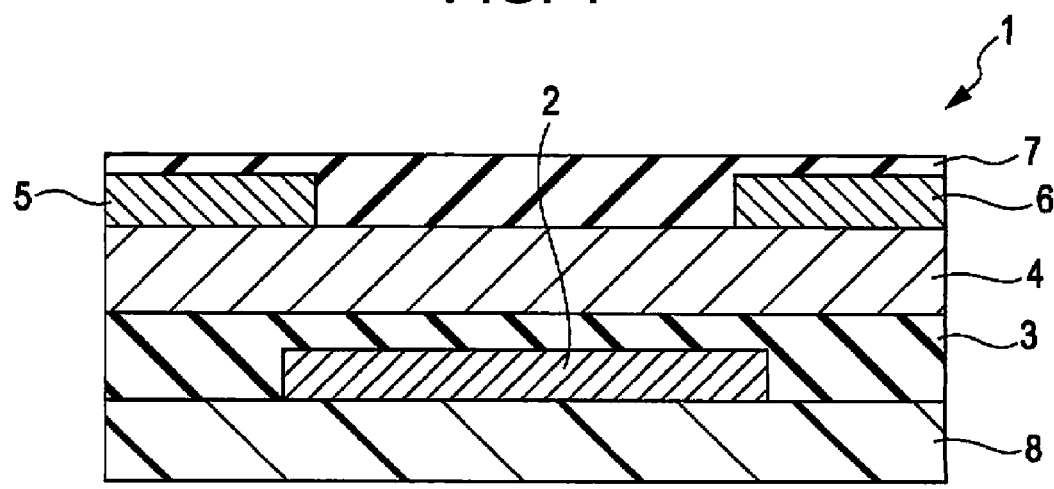
FIG. 4 is a longitudinal sectional view of a thin-film transistor according to a fourth embodiment of the invention.

FIG. 4 shows a thin-film transistor according to the fourth embodiment of the invention and is a schematic longitudinal sectional view of a thin-film transistor 1. In the following description, the upper side and the lower side in FIG. 4 is defined as the upper side and the lower side of the thin-film transistor 1.

The thin-film transistor 1 according to this embodiment is the same as in the first embodiment, except that the gate electrode 2 is located closer to the substrate 8 than the source electrode 5 and the drain electrode 6 and that the source electrode 5 and the drain electrode 6 are in contact with upper surfaces of portions of the organic semiconductor layer 4 overlapping the source electrode 5 and the drain electrode 6 in plan.

In other words, the thin-film transistor 1 shown in FIG. 4 includes the gate electrode 2 located closer to the substrate 8 than the source electrode 5 and the drain electrode 6. Furthermore, the thin-film transistor 1 includes the gate electrode 2, the first insulating layer 3, the organic semiconductor layer 4, the source electrode 5 and the drain electrode 6, and the second insulating layer 7 stacked, in that order, on the substrate 8, which is a bottom-gate bottom-contact thin-film transistor.

The thin-film transistor 1 having the structure also provides the same effects as described in the first embodiment.

(2) Method for Producing Thin-Film Transistor

The thin-film transistor 1 can be produced by, for example, a method described below.

The method for producing the thin-film transistor 1 shown in FIG. 4 includes [D1] a step of forming the gate electrode 2 on the substrate 8, [D2] a step of forming the first insulating layer 3 on the substrate 8 and the gate electrode 2, [D3] a step of forming the organic semiconductor layer 4 on the first insulating layer 3, [D4] a step of forming the source electrode 5 and the drain electrode 6 on the organic semiconductor layer 4, and [D5] a step of forming the second insulating layer 7 on the source electrode 5, the drain electrode 6, and the organic semiconductor layer 4. Each of the steps will be described below.

[D1] Step of Forming Gate Electrode

This step is performed in the same way as in the step [A5] according to the first embodiment, except that the gate electrode 2 is formed on the substrate 8.

[D2] Step of Forming First Insulating Layer

This step is performed in the same way as in the step [A4] according to the first embodiment, except that the first insulating layer 3 is formed on the substrate 8 and the gate electrode 2.

[D3] Step of Forming Organic Semiconductor Layer

This step is performed in the same way as in the step [A3] according to the first embodiment, except that the organic semiconductor layer 4 is formed on the first insulating layer 3.

[D4] Step of Forming Source Electrode and Drain Electrode

This step is performed in the same way as in the step [A2] according to the first embodiment, except that the source electrode 5 and the drain electrode 6 are formed on the organic semiconductor layer 4.

[D5] Step of Forming Second Insulating Layer

This step is performed in the same way as in the step [A1] according to the first embodiment, except that the second insulating layer 7 is formed on the source electrode 5, the drain electrode 6, and the organic semiconductor layer 4.

The thin-film transistor 1 according to this embodiment is formed by the production method including the steps described above.

Electro-Optical Device

An electro-optical device including a thin-film transistor according to an embodiment of the invention will be described below.

The electro-optical device according to an embodiment of the invention includes the foregoing electro-optical elements arranged on the thin-film transistors. Examples of the electro-optical device include liquid crystal devices such as liquid crystal display devices, organic EL devices such as organic EL display devices, and electrophoretic display devices.

An electrophoretic display device as an example of the electro-optical device including thin-film transistors according to an embodiment of the invention will be described below with reference to the attached drawings.

(1) Electrophoretic Display Device

Figure 5:
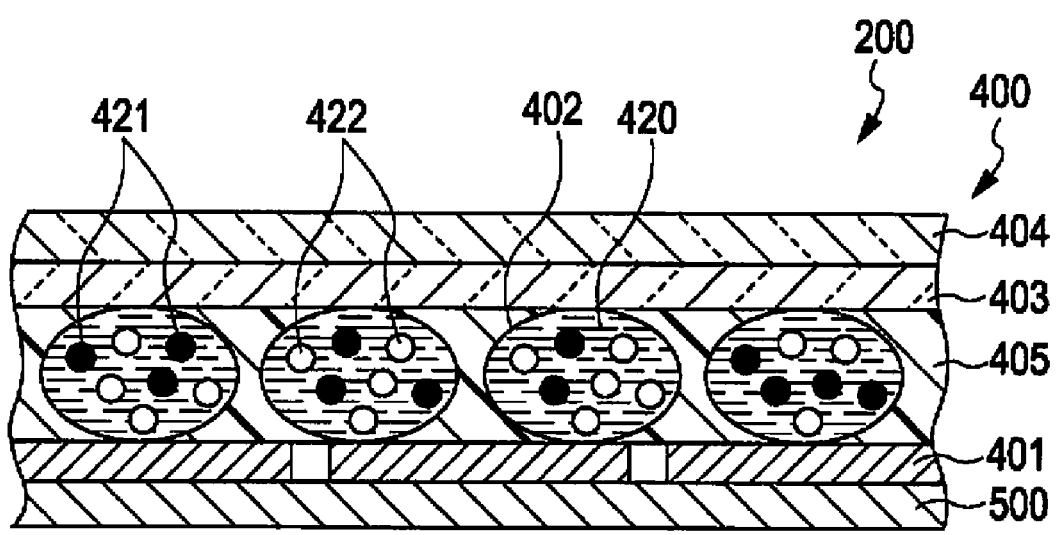
FIG. 5 is a longitudinal sectional view of an electrophoretic display device according to an embodiment.
Figure 6:
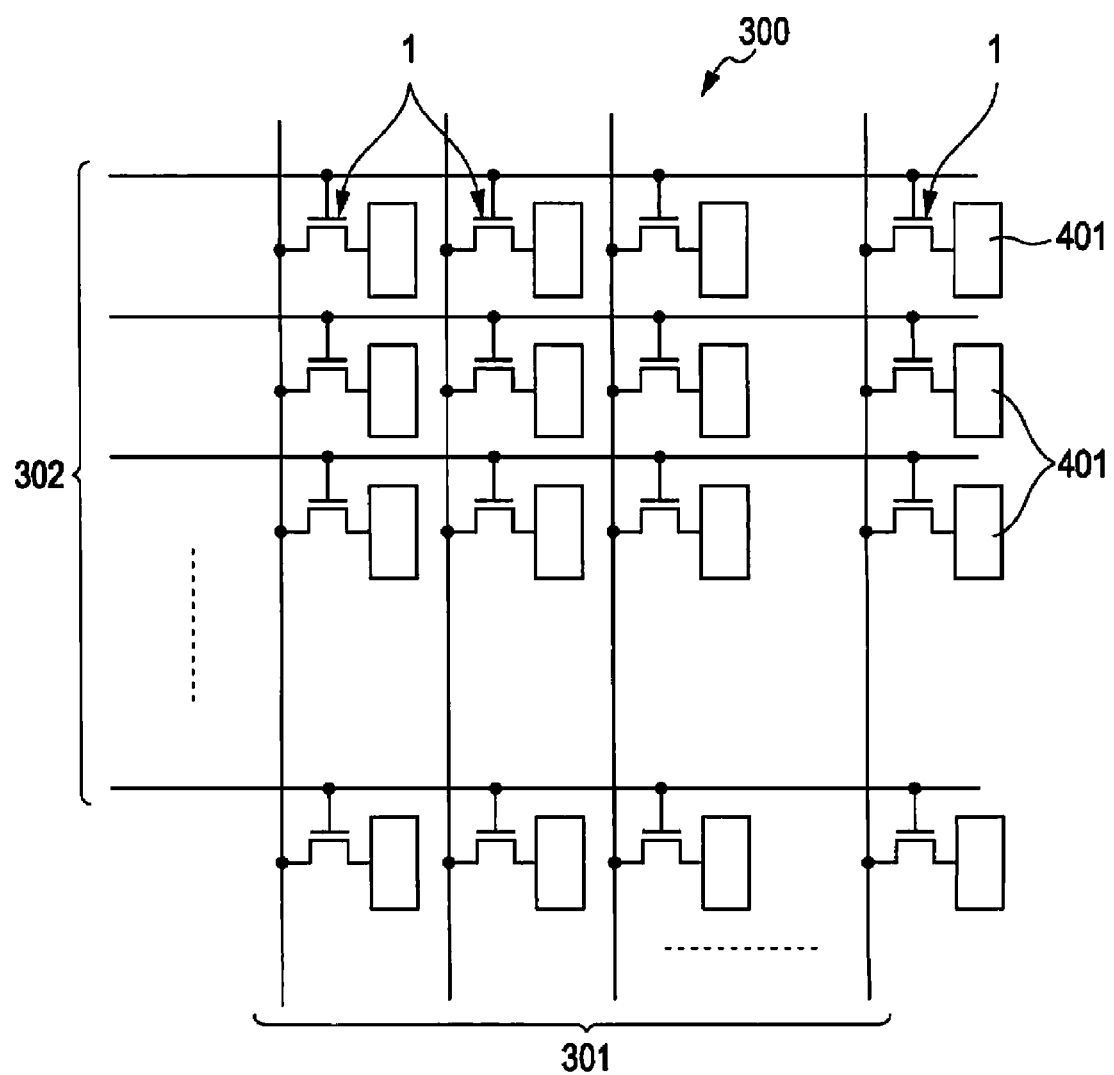
FIG. 6 is a block diagram of an active matrix unit included in the electrophoretic display device shown in FIG. 5.

FIG. 5 is a longitudinal sectional view of an electrophoretic display device according to an embodiment. FIG. 6 is a block diagram of an active matrix unit included in the electrophoretic display device shown in FIG. 5.

An electrophoretic display device 200 shown in FIG. 5 includes the active matrix unit arranged on a substrate 500 and an electrophoretic display portion 400 electrically connected to the active matrix unit.

As shown in FIG. 6, the active matrix unit 300 includes a plurality of data lines 301, a plurality of scanning lines 302 extending perpendicularly to the data lines 301, thin-film transistors 1 arranged in the vicinity of intersections of each of the data lines 301 and a corresponding one of the scanning lines 302.

In the thin-film transistors 1, gate electrodes are connected to the scanning lines 302. Source electrodes are connected to the data lines 301. Drain electrodes are connected to pixel electrodes (individual electrodes) 401 described below.

As shown in FIG. 5, the electrophoretic display portion 400 includes the pixel electrodes 401, microcapsules 402, a transparent electrode (common electrode) 403, and a transparent substrate 404 stacked, in that order, on the substrate 500.

The microcapsules 402 are fixed between the pixel electrodes 401 and the transparent electrode 403 with a binder 405.

The pixel electrodes 401 are arrayed in a matrix, i.e., the pixel electrodes 401 are regularly arranged lengthwise and crosswise.

The microcapsules 402 contain different electrophoretic particles having different properties. In this embodiment, each of the microcapsules 402 is filled with a electrophoretic dispersion 420 containing two types of electrophoretic particles 421 and 422 that are different in charge and color (hue).

In the electrophoretic display device 200, when an address signal (address voltage) to a single or the plurality of scanning lines 302, the thin-film transistors 1 connected to the scanning line(s) 302 fed with the address signals turns ON.

Thus, each of the data lines 301 and a corresponding one of the pixel electrodes 401 connected to the thin-film transistors 1 are substantially brought into conduction. At this point, when desired data sets (voltages) are supplied to the data lines 301, the data sets (voltages) are supplied to the pixel electrodes 401.

As a result, electric fields are generated between the pixel electrodes 401 and the transparent electrode 403. Each of the electrophoretic particles 421 and 422 is electrophoresed toward a corresponding one of the electrodes in response to, for example, directions and intensity of the electric fields and properties of the electrophoretic particles 421 and 422.

When the supply of the address signal (address voltage) to the scanning lines 302 is stopped, the thin-film transistors 1 turn OFF, so that each of the data lines 301 and a corresponding one of the pixel electrodes 401 connected to the thin-film transistors 1 become non-conducting.

Thus, appropriate combinations of the supply and stop of the address signal to the scanning lines 302 and the supply and stop of the data sets to the data lines 301 produce a desired image (information) on the display surface side (transparent substrate 404 side) of the electrophoretic display device 200.

In particular, in the electrophoretic display device 200 according to this embodiment, a multiple gray-scale image can be displayed because of different colors of the electrophoretic particles 421 and 422.

The electrophoretic display device 200 according to this embodiment including the active matrix unit 300. Thus, the thin-film transistors 1 connected to specific scanning lines 302 can turn ON or OFF surely and selectively, thereby minimizing the problem of crosstalk. Furthermore, an increase in the speed of the circuit operation results in a high-quality image (information).

Moreover, the electrophoretic display device 200 according to this embodiment operates at a low drive voltage, thus achieving power savings.

The electro-optical device including the active matrix unit provided with the thin-film transistors 1 is not limited to the electrophoretic display device 200. For example, the electro-optical device can also be applied to display devices, such as liquid crystal devices and organic and inorganic EL devices, and light-emitting devices.

Electronic Apparatus

The electrophoretic display device 200 may be incorporated into various electronic apparatuses. An electronic apparatus including the electrophoretic display device 200 according to an embodiment of the invention will be described below.

Electronic Paper

First, an embodiment in which an electronic apparatus according to an embodiment of the invention is applied to electronic paper will be described below.

Figure 7:
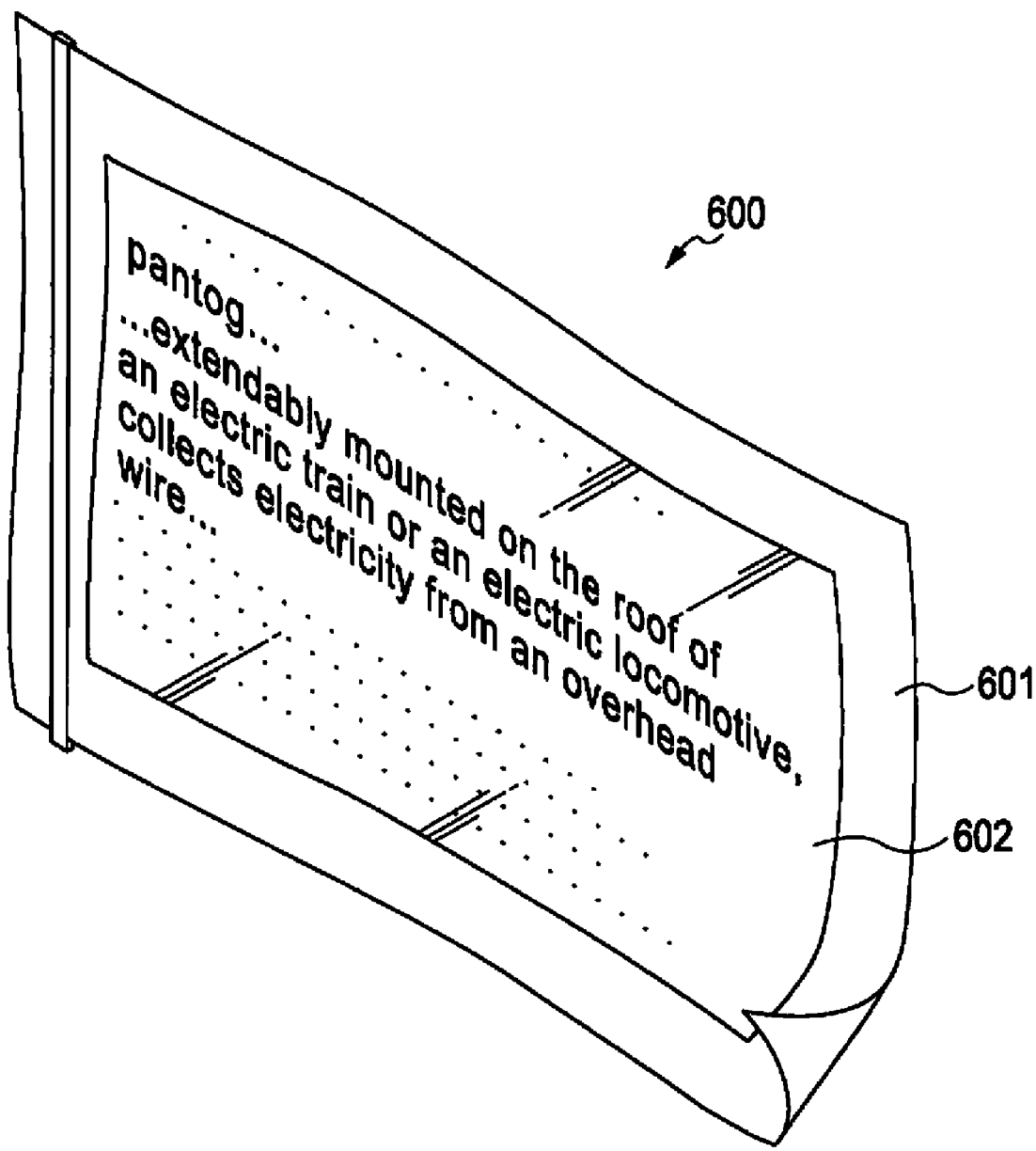
FIG. 7 is a perspective view of an example of electronic paper according to an embodiment to which an electronic apparatus according to an embodiment of the invention is applied.

FIG. 7 is a perspective view of an example of electronic paper to which the electronic apparatus according to an embodiment of the invention is applied.

The electronic paper 600 shown in this figure includes a main body 601 formed of a rewritable sheet having paper-like texture and flexibility and a display unit 602.

In the electronic paper 600, the display unit 602 is constituted by the foregoing electrophoretic display device 200.

Display

Next, an embodiment in which an electronic apparatus according to an embodiment of the invention is applied to a display will be described below.

Figure 8A:
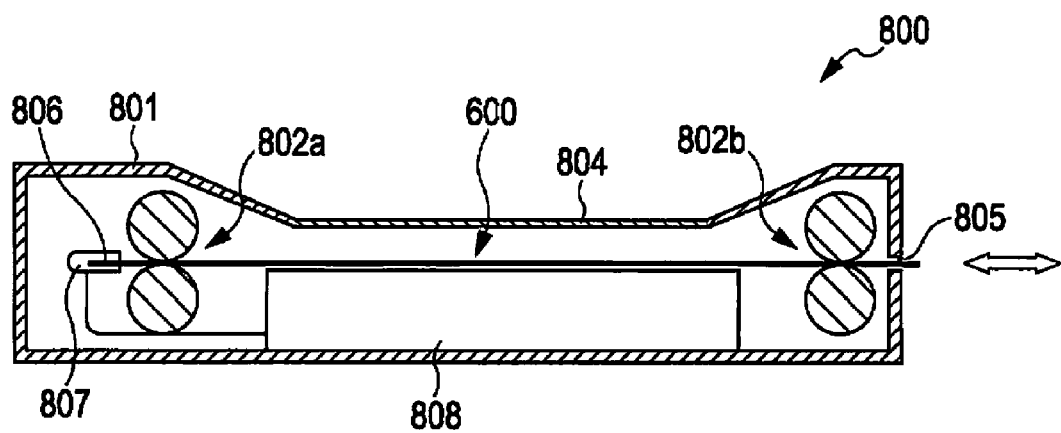
FIGS. 8A and 8B show an embodiment in which an electronic apparatus according to an embodiment of the invention is applied to a display.
Figure 8B:
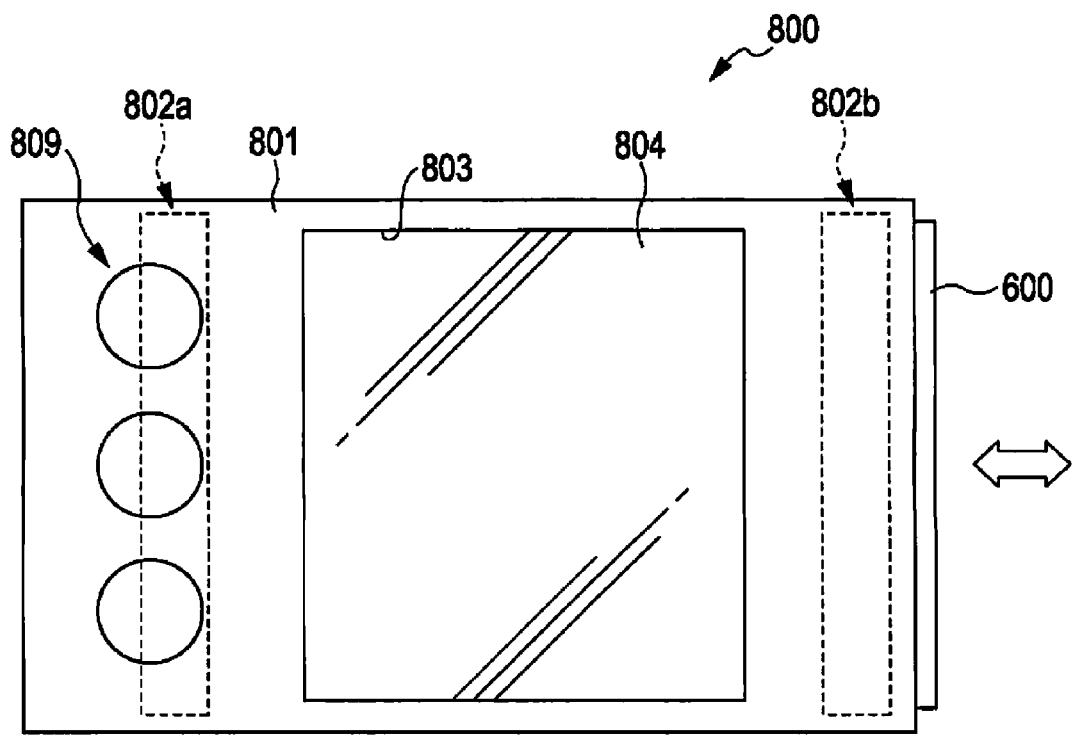

FIGS. 8A and 8B show an embodiment in which an electronic apparatus according to an embodiment of the invention is applied to a display. FIG. 8A is a cross-sectional view. FIG. 8B is a plan view.

A display 800 shown in these figures includes a main body 801 and the electronic paper 600 detachably mounted on the main body 801. The electronic paper 600 has the same structure as shown in FIG. 7.

The main body 801 includes an insertion slot 805 into which the electronic paper 600 can be inserted, the insertion slot 805 being arranged on a side of the main body 801 (the right side in the figure), and two pairs of transport rollers 802a and 802b arranged therein. When the electronic paper 600 is inserted into the main body 801 through the insertion slot 805, the electronic paper 600 is placed while being held between the pairs of transport rollers 802a and 802b.

A rectangular hole 803 is formed on a display surface side of the main body 801 (the front side of FIG. 8B). A transparent glass plate 804 is fitted into the hole 803. Thus, the electronic paper 600 placed in the main body 801 can be visually recognized from the outside of the main body 801. That is, in the display 800, the electronic paper 600 placed in the main body 801 is visually recognized through the transparent glass plate 804 arranged on the display surface side.

A terminal portion 806 is arranged at the leading end of the electronic paper 600 in the insertion direction (the left side of the figure). A socket 807 is arranged in the main body 801, the socket 807 being connected to the terminal portion 806 while the electronic paper 600 is placed in the main body 801. The socket 807 is electrically connected to a controller 808 and an operating portion 809.

In the display 800, the electronic paper 600 is detachably arranged in the main body 801. The electronic paper 600 can also be used without the main body 801.

In the display 800, the electronic paper 600 is constituted by the foregoing electrophoretic display device 200.

The electronic apparatus according to an embodiment of the invention can be applied to other apparatuses in addition to those described above. Examples of other apparatuses include television sets, viewfinder-type or direct-view-type videotape recorders, car navigation systems, pagers, electronic organizers, calculators, electronic newspapers, word processors, personal computers, workstations, videophones, point-of-sale terminals, and apparatuses provided with touch panels. The electrophoretic display device 200 can be applied to the display portion of each of the electronic apparatuses.

While the thin-film transistor, the electro-optical device, and the electronic apparatus according to the embodiments of the invention have been described above, the invention is not limited thereto.

For example, portions of the thin-film transistor, the electro-optical device, and the electronic apparatus according to the embodiments of the invention may be replaced with components having similar functions. Any component may also be added thereto.

Furthermore, the thin-film transistor according to an embodiment of the invention may have a combination of two or more of the foregoing structures.

EXAMPLES

1. Production of Thin-Film Transistor

Example 1

(1) Step of Forming Second Insulating Layer

A polyethylene naphthalate substrate (Teonex Q65 (registered trademark), manufactured by Teijin DuPont Films Japan Limited) was subjected to ultrasonic cleaning for 10 minutes in an isopropyl alcohol solvent to perform degrease surfaces thereof.

The substrate was placed in an apparatus configured to form a poly-p-xylylene film. That is, amino-p-xylylene dimer was introduced into an evaporation furnace at 200° C. under reduced pressure (0.7 Torr) and evaporated by heating. The evaporated compound was introduced into a decomposition furnace at 0.5 Torr and 600° C. and pyrolyzed to form radical monomer. Then the pressure was reduced to 0.05 Torr. The resulting radical monomer was introduced into a deposition chamber at room temperature (25° C.) and deposited on the substrate placed in the deposition chamber at a deposition rate of 0.1 μm/min to form a second insulating layer composed of poly(amino-p-xylylene) having a thickness of 1 μm.

(2) Step of Forming Source Electrode and Drain Electrode

A 10-nm-thick Cr film was deposited as an adhesion layer on the second insulating layer by vacuum evaporation. Subsequently, a 1000-nm-thick Au film was deposited by vacuum evaporation. The resulting Au/Cr film was patterned by photoetching with a photoresist (TSMR8900, Tokyo Ohka Kogyo Co., Ltd.) so as to form a source electrode and a drain electrode each having a channel length of 50 μm and a channel width of 200 μm. Then a resist was detached.

(3) Step of Forming Organic Semiconductor Layer

The substrate obtained in section 2 was rinsed by performing oxygen plasma treatment for 5 minutes at an RF power of 200 W and an oxygen flow rate of 100 sccm in a plasma treatment apparatus. Then a toluene solution of 1% by weight poly-9,9-dioctylfluorene-co-dithiophene (F8T2) was applied onto the substrate by spin coating at 2,400 rpm and dried at 60° C. for 10 minutes to form an organic semiconductor layer having a thickness of 40 nm.

(4) Step of Forming First Insulating Layer

A butyl acetate solution of 10% by weight polymethyl methacrylate (PMMA) was applied onto the organic semiconductor layer by spin coating at 2,400 rpm and dried at 60° C. for 10 minutes. Thereby, a 1000-nm-thick gate insulating layer composed of PMMA was formed.

(5) Step of Forming Gate Electrode

A gold-microparticle dispersion (trade name: Perfect Gold, manufactured by ULVAC Materials, Inc.) containing gold microparticles, each having a diameter of 10 nm, dispersed in toluene was applied onto a region (channel region) located between the source electrode and the drain electrode on the first insulating layer by an ink jet method. Then drying was performed at 80° C. for 10 minutes to form a gate electrode having a thickness of 1,000 nm.

Thereby, a top-gate bottom-contact thin-film transistor including the second insulating layer composed of poly(amino-p-xylylene) was produced through the foregoing steps.

Example 2

A top-gate bottom-contact thin-film transistor including the second insulating layer composed of poly(methylamino-p-xylylene) was produced as in Example 1, except that methylamino-p-xylylene dimer was used in place of amino-p-xylylene dimer.

Comparative Example

A top-gate bottom-contact thin-film transistor including the second insulating layer composed of poly-p-xylylene was produced as in Example 1, except that p-xylylene dimer was used in place of amino-p-xylylene dimer.

2. Evaluation

Figure 9:
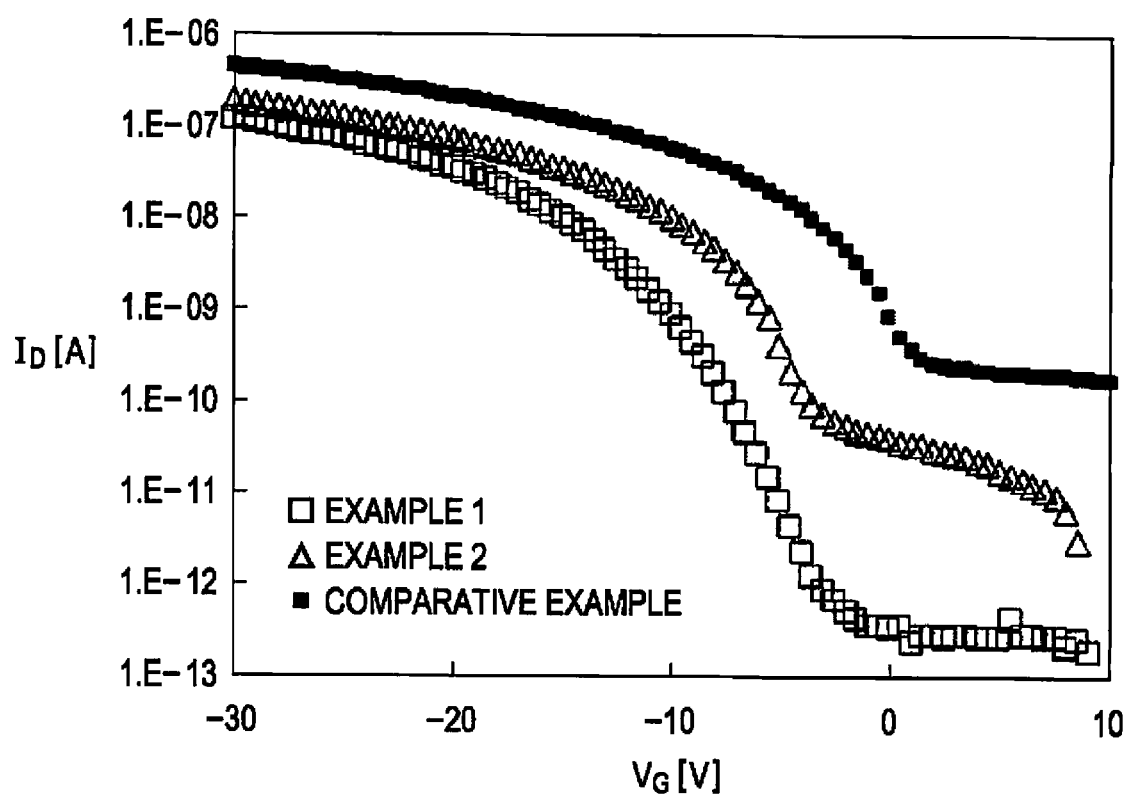
FIG. 9 is a graph showing the relationship between the gate voltage and the drain current of thin-film transistors produced in Examples and Comparative Example.

Transfer properties of the thin-film transistors produced in Examples and Comparative Example were measured with a semiconductor parameter analyzer (4156C, manufactured by Agilent Technologies). The drain current was measured under conditions in which the gate voltage was swept from +10 V to −40 V at a drain voltage of −40 V. Table 1 and FIG. 9 show the results. Items shown in Table 1 were determined by methods described below.

(1) OFF-State Current

A current at a gate voltage of zero was determined from the relationship between the gate voltage and the drain current shown in FIG. 9.

(2) ON/OFF Ratio

The ON/OFF ratio was determined from the ratio of the drain currents at gate voltages of 0 V and −40 V.

(3) Mobility

A threshold voltage was determined from the intercept of a straight line of a graph in which the vertical axis indicated the one-half power of the drain current and the horizontal axis indicated the gate voltage. Furthermore, the mobility of the transistor in the saturated region was determined from the slope of the straight line.

TABLE 1

|  | Second insulating layer | Off-state current [A] | ON/OFF ratio | Mobility | Threshold voltage [V] |
| --- | --- | --- | --- | --- | --- |
| Example 1 | Poly(amino-p-xylylene | $2 \times 10^{-13}$ | $5 \times 10^{5}$ | $2 \times 10^{-2}$ | −2 |
| Example 2 | Poly(methylamino-p-xylylene | $5 \times 10^{-11}$ | $4 \times 10^{3}$ | $3 \times 10^{-2}$ | −2 |
| Comparative Example | Poly-p-xylylene | $7 \times 10^{-10}$ | $4 \times 10^{2}$ | $5 \times 10^{-2}$ | +1 |

As shown Table 1 and FIG. 9, in any of Examples, all of the OFF-state current, the ON/OFF ratio, the mobility, and the threshold voltage was satisfactory compared with those in Comparative Example. That is, the high-performance transistors were produced with high reliability. In particular, in Examples 1 and 2, the effects were significantly provided.

The entire disclosure of Japanese Patent Application No. 2007-320243, filed Dec. 11, 2007 is expressly incorporated by reference herein.

What is claimed is:

1. A thin-film transistor comprising:
   a source electrode;
   a drain electrode arranged apart from the source electrode;
   an organic semiconductor layer arranged between the source electrode and the drain electrode so as to establish connection of the source electrode and the drain electrode;
   a first insulating layer arranged on one surface side of the organic semiconductor layer;
   a gate electrode arranged on a side of the first insulating layer opposite that on which the organic semiconductor layer lies; and
   a second insulating layer arranged on a side of the organic semiconductor layer opposite that on which the first insulating layer lies,
   wherein the organic semiconductor layer contains an organic semiconductor material having p-type semiconducting properties, and the second insulating layer contains one or more compounds of the following formula (1), so that electrons are fed from the second insulating layer into the organic semiconductor layer:

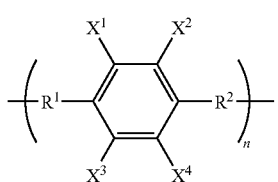

wherein $R^1$ and $R^2$ independently represent a substituted or unsubstituted alkylene group; $X^1$, $X^2$, $X^3$ and $X^4$ each represent a hydrogen atom or an electron-donating group; and n represents 100 to 100,000, wherein any two of $X^1$, $X^2$, $X^3$ and $X^4$ represent electron-donating groups.

2. The thin-film transistor according to claim 1, wherein the alkylene group has 1 to 20 carbon atoms.

3. The thin-film transistor according to claim 1, wherein at least one of the electron-donating groups has an amino group.

4. The thin-film transistor according to claim 1, wherein the organic semiconductor material having p-type semiconducting properties is a thiophene-based material.

5. The thin-film transistor according to claim 1, wherein the one or more compounds of the formula (1) each have a weight-average molecular weight of 10,000 to 1,000,000.

6. The thin-film transistor according to claim 1, wherein the second insulating layer contains at least one of poly(amino-p-xylylene) of the formula (2) and poly(methylamino-p-xylylene) of the formula (3) as the one or more compounds of the formula (1):

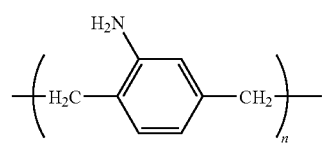

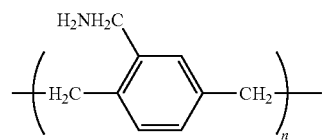

wherein each n represents 100 to 100,000.

7. The thin-film transistor according to claim 1, wherein the second insulating layer, the source electrode, the drain electrode, the organic semiconductor layer, the first insulating layer, and the gate electrode are arranged on a substrate, and
wherein the gate electrode is more distant from the substrate than the source electrode and the drain electrode.

8. The thin-film transistor according to claim 7, wherein the second insulating layer, the source electrode and the drain electrode, the organic semiconductor layer, the first insulating layer, and the gate electrode are stacked in that order on the substrate.

9. The thin-film transistor according to claim 7, wherein the second insulating layer, the organic semiconductor layer, the source electrode and the drain electrode, the first insulating layer, and the gate electrode are stacked in that order on the substrate.

10. The thin-film transistor according to claim 1, wherein the second insulating layer, the source electrode and the drain electrode, the organic semiconductor layer, the first insulating layer, and the gate electrode are arranged on a substrate, and
wherein the gate electrode is closer to the substrate than the source electrode and the drain electrode.

11. The thin-film transistor according to claim 10, wherein the gate electrode, the first insulating layer, the source electrode and the drain electrode, the organic semiconductor layer, and the second insulating layer are stacked in that order on the substrate.

12. The thin-film transistor according to claim 10, wherein the gate electrode, the first insulating layer, the organic semiconductor layer, the source electrode and the drain electrode, and the second insulating layer are stacked in that order on the substrate.

13. An electro-optical device comprising:
a thin film transistor according to claim 1.

14. An electronic apparatus comprising:
an electro-optical device according to claim 13.

15. A thin-film transistor comprising:
a source electrode;
a drain electrode arranged apart from the source electrode;
an organic semiconductor layer arranged between the source electrode and the drain electrode so as to establish connection of the source electrode and the drain electrode;
a first insulating layer arranged on one surface side of the organic semiconductor layer;
a gate electrode arranged on a side of the first insulating layer opposite that on which the organic semiconductor layer lies; and
a second insulating layer arranged on a side of the organic semiconductor layer opposite that on which the first insulating layer lies,
wherein the organic semiconductor layer contains an organic semiconductor material having p-type semiconducting properties, and the second insulating layer contains one or more compounds of the following formula (1), so that electrons are fed from the second insulating layer into the organic semiconductor layer:

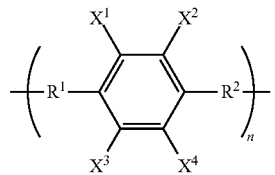

wherein $R^1$ and $R^2$ independently represent a substituted or unsubstituted alkylene group; $X^1$, $X^2$, $X^3$ and $X^4$ each represent a hydrogen atom or an electron-donating group; and n represents 100 to 100,000, wherein at least one of $X^1$, $X^2$, $X^3$ and $X^4$ represents an electron-donating group,
wherein the second insulating layer contains two or more of the one or more compounds of the formula (1), the compounds having different combinations of $X^1$, $X^2$, $X^3$, and $X^4$.

* * * * *